Sept. 3, 1968 V. Y. DOO 3,400,309

MONOLITHIC SILICON DEVICE CONTAINING DIELECTRICALLY ISOLATING FILM OF SILICON CARBIDE

Filed Oct. 18, 1965

INVENTOR

VEN Y. DOO

BY Sughrue, Rothwell, Mion, Zinn & Macpeak

ATTORNEYS

United States Patent Office 3,400,309

Patented Sept. 3, 1968

3,400,309
MONOLITHIC SILICON DEVICE CONTAINING DIELECTRICALLY ISOLATNG FILM OF SILICON CARBIDE

Ven Y. Doo, Poughkeepsie, N.Y., assignor to International Business Machines Corporation, Armonk, N.Y., a corporation of New York Filed Oct. 18, 1965, Ser. No. 497,332
2 Claims. (Cl. 317—234)

ABSTRACT OF THE DISCLOSURE

Semiconductor devices comprising single crystal silicon substrates having a plurality of electrically active elements wherein said elements are dielectrically isolated from the silicon substrate by an epitaxially grown silicon carbide layer.

Figure 1A:
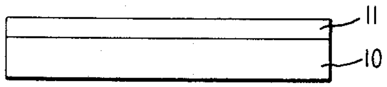

The present invention relates to improved microelectronic devices. More specifically, the invention relates to micro-electronic devices comprising an improved dielectric isolating or insulating barrier for high speed integrated circuit structures.

In recent years, there has been a great deal of attention devoted to the development of micro-miniature, solid state, electronic devices. As the technology has advanced, it has become possible to incorporate a number of discrete components into the same miniature solid state device and to stack and interconnect a series of these devices to form complex electronic systems.

However, the isolation of different elements of miniature electric components without use of bulky insulating layers has proved difficult in many cases and practically impossible where the device must accommodate high power and current frequencies. Also when a plurality of components are formed on the surface of a substrate of small dimensions, it will be apparent that problems arise in connection with obtaining satisfactory electrical isolation between adjacent components. Solutions to these problems have been suggested in the prior art, but generally result in an increase in the thickness of insulating layers and the reduction in adherence of the deposited components to the substrate and are therefore obviously unsatisfactory.

Accordingly, the primary object of the present invention is to provide a micro-electronic device in which individual electrical elements in a component are effectively isolated in a manner which provides a mechanically strong and electrically stable structure and does not require an increase in the size of the product.

A further object of the invention is to provide multicomponent, solid state micro-electronic devices in which the various components are efficiently isolated from one another, are strongly bonded to the substrate and are electrically stable.

The invention will be more fully appreciated in the light of the following detailed description of the best mode which has been contemplated for carrying out the process. The description also identifies certain preferred products of the invention. In the accompanying drawing, FIG. 1*a*–FIG. 1*d* are edge views of successive stages in the production of a micro-electronic device in accordance with the invention, and FIG. 2*a*–FIG. 2*d* are edge views of successive stages of an alternate procedure for carrying out the invention. The views shown in the drawing are obviously greatly enlarged for clarity and there is no attempt to show the various layers in true scale.

Briefly, the present invention comprises dielectrically isolating electrical elements of an electrical compound from each other or a plurality of electrical components one from another by interposing between elements of a component or between separate components an epitaxially grown silicon carbide thin film. It is understood that various other insulating layers such as silicon monoxide and silicon dioxide have been used. However, silicon monoxide and silicon dioxide cannot be deposited epitaxially on a single crystal silicon substrate. Only non-crystalline amorphous oxide films are obtained when SiO or $SiO_2$ are deposited on monocrystalline semiconductor material. Subsequent deposition of silicon material on the top of the silicon monoxide or dioxide insulating layer will form fine grain polycrystalline silicon material which has little value for device fabrication. Therefore in oxide isolation, very complicated processes have to be used to permit the formation of a final structure containing monolithic silicon regions.

On the other hand, monocrystalline silicone carbide can be epitaxially deposited onto single crystal silicon material since the deposited silicon carbide material is single crystal in form and has the same structure as the single crystal silicon material. Consequently epitaxial deposition of monocrystalline silicon layers on the top of the monocrystalline silicon carbide film is possible. In the preferred procedure, the insulating epitaxial silicon carbide film is deposited upon a silicon single crystal substrate, and then the epitaxial monocrystalline silicon is grown on top of the silicon carbide layer.

The invention also encompasses micro-electronic devices comprising an electrical component formed by depositing electrically conductive, semi-conductive or resistive materials on the surface of a monolithic, single crystal silicon substrate wherein an epitaxially grown layer of silicon carbide is provided as an insulating or isolating layer between the substrate and the layers of electrically active material.

The starting substrate is a single crystal silicon wafer having a (111) or (100) wafer orientation and produced by drawing a rod from a silicon melt which is subsequently cut, lapped, and polished to provide the desired wafers. The dimensions of each wafer are 0.008" to 0.015" thick and 1" in diameter. The wafer is prepared in the following manner: the surface of the wafer is lapped flat with 0.012" diameter alumina powders and then chemically polished in HF-HNO-acetic acid solution. The wafer is then rinsed in deionized water and stored in a dust free container.

The prepared wafer or substrate is placed in a standard quartz vapor deposition chamber. The substrate is placed on a graphite or molybdenum susceptor which is coupled to an RF coil which is located outside of the deposition chamber. The substrate is heated to a temperature of from about 1050° C. to 1250° C. Temperatures in the range of from 1050° C. to 1200° C. are preferred. During heating, the pressure in the chamber is maintained at about atmospheric pressure. The source materials used are silicon tetrachloride, propane and hydrogen. Hydrogen is used as a carrier gas for silicon tetrachloride.

The flow rate of the reactants into the vapor deposition chamber is about 45 cc., 25 cc. and 10,000 cc. per minute for silicon tetrachloride, propane and hydrogen respectively.

After 20 minutes, the depositing operation is discontinued with the result that a silicon carbide layer having a thickness of approximately $2\mu$ to $3\mu$ is deposited on the single crystal silicon substrate. The silicon substrate preferably should be intrinsic so that the deposited silicon carbide will not be contaminated by the dopant from the silicon substrate.

One or more layers of electrically active material may then be deposited over the silicon carbide layer. For example, several layers of N-type, $N^+$-type and $N^-$-type silicon may then be deposited over the silicon carbide, where N, $N^+$ and $N^-$ indicate respectively the moderate, heavy, and lightly doped silicon containing N-type impurities. The N-type layers are preferably formed by doping silicon with phosphine or arsine. The silicon layer that is deposited immediately on the top of the silicon carbide film should preferably be very lightly doped, e.g. $N^-$-type silicon to minimize the possible contamination of silicon carbide through solid state diffusion.

In a preferred embodiment, the coated device is next masked with a suitable material, such as silicon dioxide, and is then etched with a solution of etchant which selectively attacks the exposed surface but does not attack the resist pattern and does not attack the underlying silicon carbide isolating layer. As a result of the etching step one or more channels or moats are produced which separate at least a portion of the electrically active material from the rest of the electrically active layer or layers. These channels may then be coated with a suitable insulating material and then filled with polycrystalline silicon. The insulating material can be additional silicon carbide or other dielectrics such as silicon dioxide which may be vapor deposited.

The upper surface of the wafer may then be polished. The epitaxially grown silicon layers deposited on top of the silicon carbide film are now divided into islands and separated from each other by silicon carbide at the bottom and silicon carbide or some other dielectric on the sides. Thus, devices made in any of the N-type epitaxial grown silicon islands by alloying or diffusion steps well known in the art will be separated by the silicon carbide layer at the bottom and a dielectric layer on the sides.

Referring now to FIG. 1*a*–FIG. 1*d*, the epitaxially grown silicon carbide layer 11 deposited on the surface of monocrystalline substrate 10 takes on the crystal orientation of the substrate. This results in a silicon carbide layer which is itself crystalline, highly dense and an excellent dielectric material for isolating from the substrate subsequently deposited layers of electrically active material.

There may then be deposited over the silicon carbide layer 11 one or more layers, 12, 13 and 14 of electrically active material such as a series of N-type conductivity semiconductive silicon layers, resistive layers, such as glass-metal cermet compositions, or conductive copper or aluminum films.

Figure 1B:
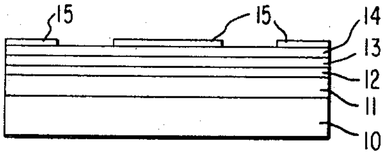

As shown in FIG. 1*b*, a layer 12 of $N^-$-type silicon semiconductive material may first be epitaxially deposited on the surface of the silicon carbide layer 11 followed by a layer 13 of $N^+$-type conductivity and a layer 14 of N-type silicon semiconductive material. A mask of silicon dioxide 15 is then deposited over these layers and by conventional photolithographic masking and etching techniques the assembly is etched in a suitable solution, such as hydrofluoric-nitric-acetic acid mixture.

Figure 1C:
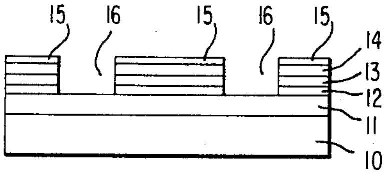

The etching operation produces a structure generally shown in FIG. 1*c* wherein channels 16 penetrate the various N-type silicon semiconductive layers 12, 13 and 14 down to the silicon carbide layer 11.

Figure 1D:
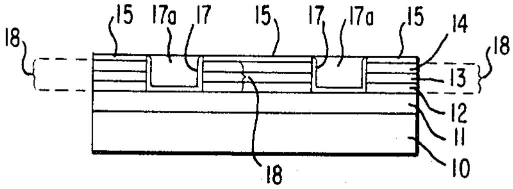

In the next step, as illustrated in FIG. 1*d*, the substrate is coated with insulating material 17 which coats the channels 16 with the insulating material 17. The insulating material 17 may be additional silicon carbide or some other dielectric material, such as silicon dioxide, to provide electrical isolation. Deposition of polycrystalline silicon **17*a* fills the channels 16. Thus, a structure is produced in which the epitaxially grown N-layers of a semiconductive component are electrically isolated from the silicon substrate 10 and multiple components 18 are separated from one another by the silicon carbide barrier layer 11 and the insulating layer 17**.

In the embodiment shown in FIG. 2*a*–FIG. 2*d*, view *a*, a single crystal silicon substrate 20 is first coated with an isolating layer of silicon carbide 21 and then with a layer 22 of $N^+$-type silicon semiconductive material and a layer 23 of N-type silicon semiconductor material. The assembly is then masked with a suitable masking layer 24, such as silicon dioxide, and channels 29 are produced by conventional photolithographic masking and etching techniques.

Figure 2A:
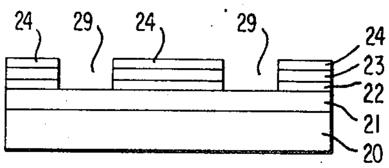
Figure 2B:
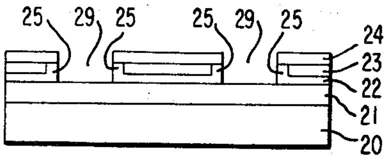

Next, as shown in FIG. 2*b*, an $N^+$ impurity of high diffusivity is diffused into the side walls of the etched channels 29 so that the exposed portions of the layer of N-type material is converted to $N^+$-type silicon. Now, the $N^+$ silicon layer 22 and diffused $N^+$-type portions 25 reach to the wafer surface which minimizes collector resistance in transistor fabrication.

Figure 2C:
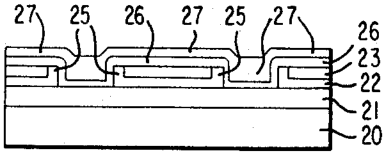

As shown in FIG. 2*c*, masking layer 24 is then preferably removed and a layer of silicon carbide 26 or another dielectric, such as silicon dioxide, is then deposited over the top of the device and onto the side walls and bottoms of the channels 29 to electrically isolate the components. The channels are next filled with a high temperature resistant material 27, such as polycrystalline silicon. If desired, the material 27 can be insulating material such as silicon dioxide or silicon carbide.

Figure 2D:
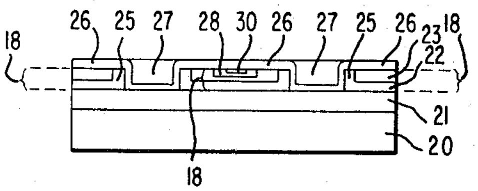

The excess poly-Si 27 is then polished off, as shown in FIG. 2*d*, to produce a structure wherein the individual components 18 are electrically isolated by layers 21 and 26.

Active semiconductor devices are made in the N-type epitaxial silicon layer by conventional alloying and/or diffusion steps. In fabricating a transistor device, a P-type base region 28 and $N^+$-type emitter region 30 can be formed by conventional diffusion techniques. Electrical leads can be formed to the collector, base, and emitter regions.

It will be obvious to those skilled in the art that the process and products illustratively described herein may be modified in varying respects without departing from the spirit or scope of the present invention as expressed in the following claims.

What is claimed is:

1. A composite, monocrystalline semi-conductor device comprising a monocrystalline silicon substrate having a dielectrically isolating film of silicon carbide epitaxially grown thereon and a plurality of monocrystalline semiconductor devices epitaxially grown on said film of silicon carbide.

2. The semi-conductor device according to claim 1 wherein said plurality of semi-conductor devices are isolated from each other by at least one channel having coated therein an epitaxial layer of silicon carbide.

References Cited

UNITED STATES PATENTS

| | | | |
|---|---|---|---|
| 2,840,494 | 6/1958 | Parker | 317—235 |
| 3,157,541 | 11/1964 | Heywang et al. | 148—174 |
| 3,158,788 | 11/1964 | Last | 317—235 |

JOHN W. HUCKERT, *Primary Examiner.*

J. D. CRAIG, *Assistant Examiner.*